US008311659B1

(12) United States Patent
Chen et al.

(10) Patent No.: US 8,311,659 B1
(45) Date of Patent: Nov. 13, 2012

(54) IDENTIFYING NON-RANDOMNESS IN INTEGRATED CIRCUIT PRODUCT YIELD

(75) Inventors: Cinti X. Chen, San Jose, CA (US); Joe W. Zhao, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 471 days.

(21) Appl. No.: 12/556,071

(22) Filed: Sep. 9, 2009

(51) Int. Cl.
*G06F 19/00* (2011.01)

(52) U.S. Cl. ............ 700/108; 700/21; 700/79; 700/121; 702/82; 702/83; 702/84

(58) Field of Classification Search .............. 700/21, 700/79, 80, 121; 702/81, 82, 83, 84
See application file for complete search history.

(56) References Cited

U.S. PATENT DOCUMENTS

| 5,497,381 | A  | * | 3/1996 | O'Donoghue et al. | ........ 714/745 |
| 6,414,508 | B1 | * | 7/2002 | London | ............... 324/762.05 |
| 2004/0175943 | A1 | * | 9/2004 | Waksman | .................... 438/689 |
| 2006/0181700 | A1 | * | 8/2006 | Andrews et al. | ........... 356/237.2 |
| 2008/0232674 | A1 | * | 9/2008 | Sakai et al. | .................... 382/149 |

* cited by examiner

*Primary Examiner* — Mohammad Ali
*Assistant Examiner* — Nathan Laughlin
(74) *Attorney, Agent, or Firm* — Kevin T. Cuenot

(57) ABSTRACT

A method of analyzing integrated circuit (IC) product yield can include storing, within a memory of a system comprising a processor, parametric data from a manufacturing process of an IC and determining a measure of non-random variation for at least one parameter of the parametric data using a pattern detection technique. The processor can compare the measure of non-random variation to a randomness criteria and selectively output a notification indicating that variation in the parameter is non-random according to the comparison of the measure of non-random variation to the randomness criteria.

11 Claims, 8 Drawing Sheets

IDENTIFYING NON-RANDOMNESS IN INTEGRATED CIRCUIT PRODUCT YIELD

FIELD OF THE INVENTION

The embodiments disclosed within this specification relate to integrated circuit (IC) devices. More particularly, the embodiments relate to improving IC product yields.

BACKGROUND

A commercially successful integrated circuit (IC) is often dependent upon high product yields to keep manufacturing costs at a level that provides product profitability at market competitive prices. The phrase "product yield," in terms of ICs, is typically defined as the percentage of functional ICs generated out of the total number of ICs fabricated using a particular manufacturing process for ICs. IC product yield is affected by a variety of factors that permeate nearly the entire manufacturing process.

One cause of decreased IC product yield relates to process imperfections. Process imperfections can create parameter variations between process runs for an IC, between differing wafers within a single process run, or between ICs within a same wafer. For example, the value of a particular resistor can vary from one IC to another according to the geographic region of the wafer in which each IC is located. In another example, capacitance values may be higher on wafers processed at the beginning of a process run than wafers processed at the end of the process run.

Another cause of decreased IC product yield relates to the testing equipment itself. More particularly, test and/or measuring equipment can lose calibration or alignment resulting in the collection of inaccurate data. Assessing inaccurate data can lead to the rejection of operable ICs and, therefore, the needless degradation of product yields.

SUMMARY

The embodiments disclosed within this specification relate to integrated circuits (ICs) and, more particularly, to improving IC product yields. One embodiment of the present invention includes a method of analyzing IC product yield within a system comprising a processor and a memory. The method can include storing, within the memory, parametric data from a manufacturing process for an IC and determining a measure of non-random variation for at least one parameter of the parametric data using a pattern detection technique. The processor can compare the measure of non-random variation to a randomness criterion and selectively output a notification indicating that variation in the parameter(s) is non-random according to the comparison of the measure of non-random variation to the randomness criteria.

Determining the measure of non-random variation can include determining a mean value for at least one parameter of the parametric data for each of a plurality of wafers. Each wafer can include a plurality of the ICs. For each of a plurality of successive wafer pairs, a determination can be made as to whether the mean value for a second wafer of the successive wafer pair increases or decreases from the mean value of a first wafer of the successive pair of wafers. The method can store an indication of whether the mean value increases or decreases for each successive wafer pair as a sequence of indications and calculate a measure of non-random variation according to the sequence of indications.

In one aspect, calculating the measure of non-random variation according to the sequence of indications can include determining a number of occurrences of a pattern of indications within the sequence of indications and calculating the measure of non-random variation according to the number of occurrences of the pattern of indications.

Determining the measure of non-random variation can include, for each of a plurality of data point sets, wherein each data point set comprises a plurality of data points for at least one parameter within the parametric data, calculating a curve fit for the data point set. The measure of non-random variation can be calculated according to Y-intercept points of the curve fits. In one aspect, each data point set can comprise a plurality of data points collected from a plurality of ICs associated with at least one site within a reticle field, wherein the reticle field corresponds to a reticle used during the manufacturing process.

Determining the measure of non-random variation can include, for each of a plurality of data point sets, calculating a curve fit for the data point set. Each data point set comprises a plurality of data points for at least one parameter of the parametric data. The measure of non-random variation can be calculated according to slopes of the curve fits. In one aspect, each data point set can correspond to a plurality of data points collected from a plurality of ICs associated with at least one site within a reticle field. The reticle field can correspond to a reticle used during the manufacturing process.

In another aspect, determining a measure of non-random variation can include, for each of a plurality of IC device sets, determining a number of bin failure occurrences within each IC device set. Each IC device set can include at least one IC manufactured using the manufacturing process. A mean number of bin failure occurrences per IC can be determined. The measure of non-random variation can be calculated according to the number of bin failure occurrences within the IC device set and the mean number of bin failure occurrences per IC device set. Each IC device set can include at least one IC associated with at least one site of a test probe used during the manufacturing process.

Another embodiment of the present invention includes a system for analyzing IC product yield that includes a memory storing program code and parametric data from a manufacturing process of an IC. The system further can include a processor coupled to the memory, wherein the processor, upon executing the program code, performs operations including determining a measure of non-random variation for at least one parameter of the parametric data using a pattern detection technique. The processor further can compare the measure of non-random variation to a randomness criterion and selectively output a notification indicating that variation in the parameter(s) is non-random according to the comparison of the measure of non-random variation to the randomness criterion.

Determining the measure of non-random variation can include determining a mean value for at least one parameter of the parametric data for each of a plurality of wafers. Each wafer can include a plurality of the ICs. For each of a plurality of successive wafer pairs, a determination can be made as to whether the mean value for a second wafer of a successive wafer pair increases or decreases from the mean value of a first wafer of the successive pair of wafers. Determining a measure of non-random variation further can include storing an indication of whether the mean value increases or decreases for each successive wafer pair as a sequence of indications. A measure of non-random variation can be calculated according to the sequence of indications.

Calculating the measure of non-random variation according to the sequence of indications can include determining a number of occurrences of a pattern of indications within the sequence of indications. The measure of non-random variation can be calculated according to the number of occurrences of the pattern of indications.

Determining the measure of non-random variation can include, for each of a plurality of data point sets, calculating a curve fit for the data point set. Each data point set can include a plurality of data points for a parameter of the parametric data. The measure of non-random variation can be calculated according to Y-intercept points of the curve fits.

Determining the measure of non-random variation can include, for each of a plurality of data point sets, calculating a curve fit for the data point set. Each data point set can include a plurality of data points for a parameter of the parametric data. The measure of non-random variation can be calculated according to slopes of the curve fits.

In another aspect, determining the measure of non-random variation can include, for each of a plurality of IC device sets, determining a number of bin failure occurrences within each IC device set. Each IC device set can include at least one IC manufactured using the manufacturing process. The system can determine a mean number of bin failure occurrences per IC device set. The measure of non-random variation can be calculated according to the number of bin failure occurrences within the IC device set and the mean number of bin failures occurrences per IC device set.

Another embodiment of the present invention can include an article of manufacture that includes a data storage device usable by a system comprising a processor and a memory. The data storage device stores program code that, when executed by the system, causes the system to perform executable operations. The executable operations can include storing, within the memory, parametric data from a manufacturing process for an IC and determining a measure of non-random variation for at least one parameter of the parametric data using a pattern detection technique. The executable operations can include comparing the measure of non-random variation to a randomness criterion. A notification can be selectively output indicating that variation in the parameter is non-random according to the comparison of the measure of non-random variation to the randomness criterion.

The operation of determining a measure of non-random variation can include determining a mean value for at least one parameter of the parametric data for each of a plurality of wafers, wherein each wafer comprises a plurality of the ICs, and, for each of a plurality of successive wafer pairs, determining whether the mean value for a second wafer of the successive wafer pair increases or decreases from the mean value of a first wafer of the successive pair of wafers. An indication of whether the mean value increases or decreases for each successive wafer pair can be stored as a sequence of indications. A measure of non-random variation can be calculated according to the sequence of indications.

The operation of determining a measure of non-random variation can include, for each of a plurality of data point sets, wherein each data point set comprises a plurality of data points for at least one parameter within the parametric data, calculating a curve fit for the data point set and calculating the measure of non-random variation according to Y-intercept points of the curve fits.

The operation of determining a measure of non-random variation can include, for each of a plurality of data point sets, wherein each data point set comprises a plurality of data points for at least one parameter of the parametric data, calculating a curve fit for the data point set and calculating the measure of non-random variation according to slopes of the curve fits.

In another aspect, the operation of determining a measure of non-random variation can include, for each of a plurality of IC device sets, wherein each IC device set comprises at least one IC manufactured using the manufacturing process, determining a number of bin failure occurrences within each IC device set and determining a mean number of bin failure occurrences per IC device set. The measure of non-random variation can be calculated according to the number of bin failure occurrences within the IC device sets and the mean number of bin failure occurrences per IC device set.

DETAILED DESCRIPTION

While the specification concludes with claims defining the features of the embodiments of the invention that are regarded as novel, it is believed that the embodiments of the invention will be better understood from a consideration of the description in conjunction with the drawings. As required, detailed embodiments of the present invention are disclosed herein; however, it is to be understood that the disclosed embodiments are merely exemplary of the inventive arrangements, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the embodiments of the invention.

The embodiments disclosed within this specification relate to integrated circuits (ICs), and more particularly to pattern mining IC related parametric data. In accordance with the inventive arrangements disclosed herein, parametric data from silicon wafers and IC test measurements collected from, e.g., before, during, and/or after, an IC manufacturing process can be stored in memory. The stored parametric data can be analyzed using one or more pattern detection techniques selected from a pattern detection technique library. Using the pattern detection technique(s), a measure of non-random variation for a selected parameter of the parametric data can be determined.

Increased levels of non-random variation in parametric data can indicate the cause, or causes, of decreased IC product yield. Additionally, particular patterns of non-random variation in one or more parameters of the parametric data can be correlated with, and therefore indicate, known causes of IC product yield degradation. When the measure of non-random variation for the parameter meets one or more randomness criteria, a notification can be generated alerting a user to excessive levels of non-random variation for the selected parameter(s) of the parametric data and, accordingly, to possible causes of reduced IC product yield. Detecting non-random data patterns within parametric data, whether at the die, wafer, or tester level, can assist engineers in improving manufacturing processes, improving product performance, and preventing catastrophic IC failures, thereby reducing IC manufacturing costs and increasing IC reliability.

Figure 1:
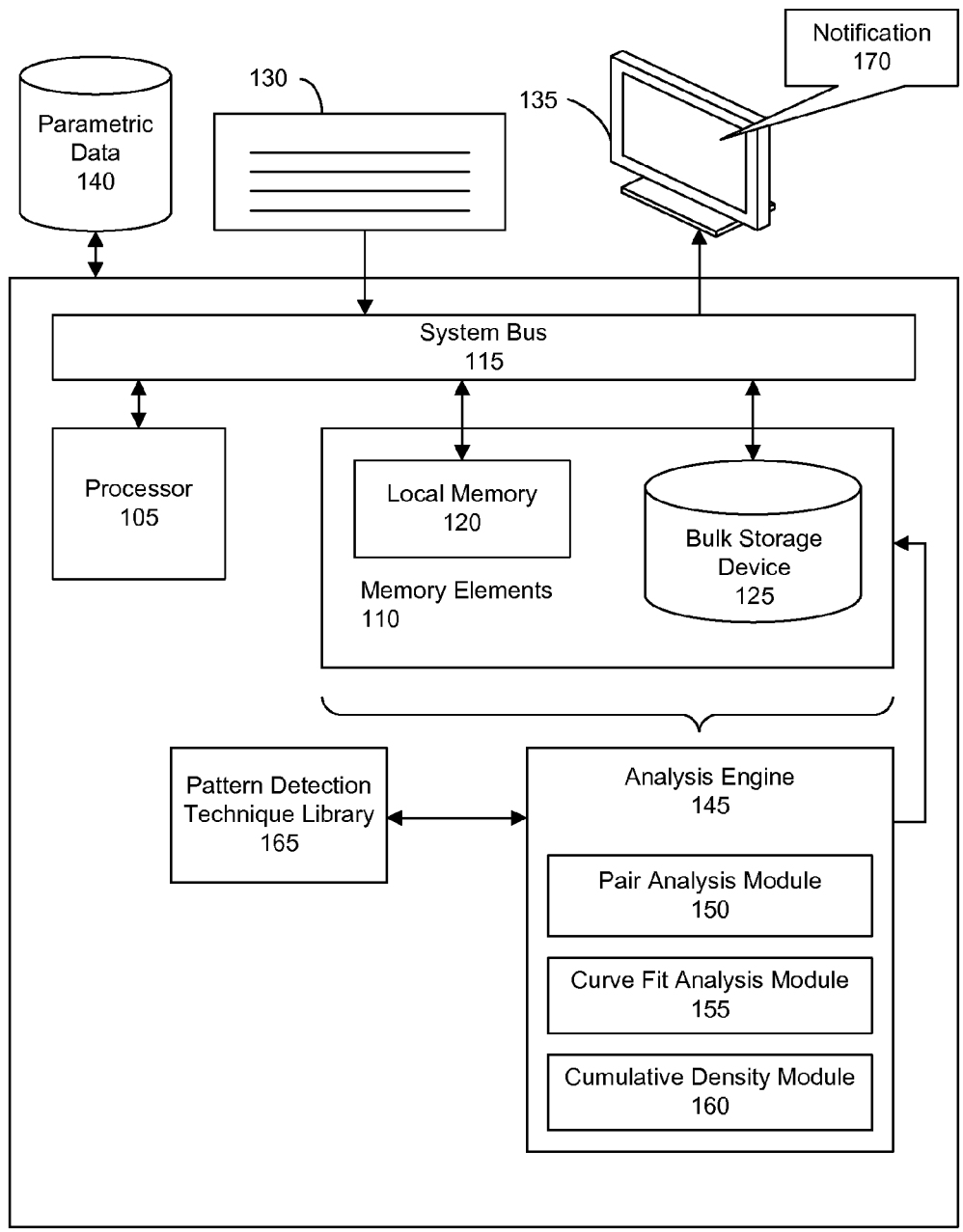
FIG. 1 is a block diagram illustrating a system for improving yield of a manufacturing process for integrated circuits (ICs) in accordance with one embodiment of the present invention.

FIG. 1 is a block diagram illustrating a system 100 for improving yield of a manufacturing process for an IC in accordance with one embodiment of the present invention. In one aspect, system 100 can analyze parametric data collected during the manufacturing of an IC and analyze the parametric data to identify likely causes of reduced IC product yield.

System 100 can include at least one processor 105 coupled to memory elements 110 through a system bus 115. As such, system 100 can store program code within memory elements 110. Processor 105 can execute the program code accessed from memory elements 110 via system bus 115. In one aspect, for example, system 100 can be implemented as a computer that is suitable for storing and/or executing program code such as analysis engine 145. It should be appreciated, however, that system 100 can be implemented in the form of any system comprising a processor and memory that is capable of performing the functions described within this specification.

Memory elements 110 can include one or more physical memory devices such as, for example, local memory 120 and one or more bulk storage devices 125. Local memory 120 refers to random access memory or other non-persistent memory device(s) generally used during actual execution of the program code. Bulk storage device(s) 125 can be implemented as a hard drive or other persistent data storage device. System 100 also can include one or more cache memories (not shown) that provide temporary storage of at least some program code in order to reduce the number of times program code must be retrieved from bulk storage device 125 during execution.

Input/output (I/O) devices such as a keyboard 130, a display 135, and a pointing device (not shown) optionally can be coupled to system 100. The I/O devices can be coupled to system 100 either directly or through intervening I/O controllers. Network adapters also can be coupled to system 100 to enable system 100 to become coupled to other systems, computer systems, remote printers, and/or remote storage devices through intervening private or public networks. Modems, cable modems, and Ethernet cards are examples of different types of network adapters that can be used with system 100.

In operation, analysis engine 145, executing within processor 105, can receive and analyze parametric data 140 collected during an IC manufacturing process. As such, parametric data 140 can include a variety of data types collected during fabrication of the IC, which can include data collected prior, and subsequent, to IC packaging. Parametric data 140 can include, but is not limited to, inline critical dimension data, scribe e-test data, wafer probe data, temperature dependent performance data, product sort data, i.e., both pre and post packaging, and the like. Parametric data 140 can include measurements of process and IC parameters such as process layer thickness and width dimensions, unit resistances, unit capacitances, unit inductances, transistor transconductance, transistor switching speed, clock skew, or any other parameter that is measurable and describes a physical or performance parameter of an IC or the manufacturing process used to implement the IC. For example, parametric data 140 can be collected from measurements of standard test devices, occupying each wafer, which are measured to track changes in process parameters over successive manufacturing runs of the IC.

To analyze parametric data 140, one or more pattern detection techniques can be selected from pattern detection technique library (hereafter "library") 165 to analyze one or more parameters of parametric data 140. Library 165 can include various pattern detection techniques that can indentify non-random variation of values for one or more selected parameters within parametric data 140. The pattern detection techniques can help identify IC fabrication and processing effects that can degrade IC product yield. These IC fabrication and processing effects can include, but are not limited to, wafer placement processing effects, test probe defects, reticle alignment issues, temperature and time related device degradation, processing trends, and the like. Each pattern detection technique can be implemented within analysis engine 145.

More particularly, each pattern detection technique from library 165 can specify a particular type of effect, anomaly, or trait within parametric data 140 to be analyzed. For example, one pattern detection technique can specify settings or instructions for one or more of the pair analysis module 150, the curve fit analysis module 155, or the cumulative density module 160 for identifying non-randomness with respect to odd even effects. Another pattern detection technique can specify which ICs, e.g., every third or fourth, or which wafers, e.g., every second, third, etc., are to be reviewed for non-random behavior. Each pattern detection technique will specify its own criteria or criterion for non-randomness. As such, each pattern detection technique provides a configuration to the relevant module of analysis engine 145 to specify what phenomena are being search for within the parametric data 140 and the criteria for determining whether the phenomena exhibits non-random behavior.

Analysis engine 145 can include a pair analysis module 150, a curve fit analysis module 155, and a cumulative density module 160. To analyze a parameter of parametric data 140 using a selected pattern detection technique from library 165, the pattern detection technique further can specify, and the analysis module 145 can invoke, one of pair analysis module 150, curve fit analysis module 155, or cumulative density module 160. Each of pair analysis module 150, curve fit analysis module 155, and cumulative density module 160 can implement the processing specified by the selected pattern detection technique obtained from library 165 to analyze parametric data 140.

When specified by a pattern detection technique of library 165, and invoked by data analysis engine 145, pair analysis module 150 can receive data for at least one parameter of parametric data 140 and analyze the data for wafer to wafer non-random variation. In IC manufacturing, multiple instances of an IC can be built within a single silicon wafer. Using a parameter of parametric data 140 collected from each IC within each of two or more wafers, pair analysis module 150 can determine a mean value of the parameter for each wafer. Pair analysis module 150 can calculate a measure of non-random variation for each wafer according to the mean value of the parameter of the wafer.

When specified by a pattern detection technique of library 165, and invoked by data analysis engine 145, curve fit analysis module 155 can receive two or more data point sets. Each data point set can include two or more data points for one or more parameters of parametric data 140. For each data point set, curve fit analysis module 150 can perform a curve fit using the data points within the data point set. Using Y-intercept and/or slope values of the curve fit for each data point set, curve fit analysis module 155 can calculate a measure of non-random variation for each data point set.

When specified by a pattern detection technique of library 165, and invoked by data analysis engine 145, cumulative density module 160 can receive parametric data for two or more IC device sets. Each IC device set can include bin failure data for at least one IC manufactured using an IC manufacturing process. Each IC device set represents a grouping of ICs according to a feature shared by each IC of the IC device set. For example, an IC device set can include each IC manufactured within a particular wafer or a particular wafer lot. In another example, an IC device set can include each IC tested at a particular test site using a multisite probe card for a particular process run lot. Cumulative density module 160 can determine a number of bin failures occurring within each IC device set. In addition, cumulative density module 160 can determine a mean number of bin failures occurring per IC device set among a plurality of IC device sets. Using the number of bin failures occurring within each IC device set and the mean number of bin failures occurring per IC device set, cumulative density module 160 can calculate a measure of non-random variation for each IC device set.

The measure of non-random variation calculated by pair analysis module 150, curve fit analysis module 155, or cumulative density module 160 can be stored in memory elements 110. Analysis engine 145 can compare the stored measure of non-random variation to randomness criteria. As noted, the randomness criteria can be specified by the selected pattern detection technique. When the randomness criteria are met, notification 170 can be output indicating that at least one parameter of the parametric data exhibits excessive levels of non-random variation. As used herein, "outputting" and/or "output" can mean, for example, storing within memory elements 110, e.g., writing to a file stored within memory elements 110, writing to the user display 135 or other output device, playing audible notifications, sending or transmitting to another system, exporting, or the like.

Figure 2:
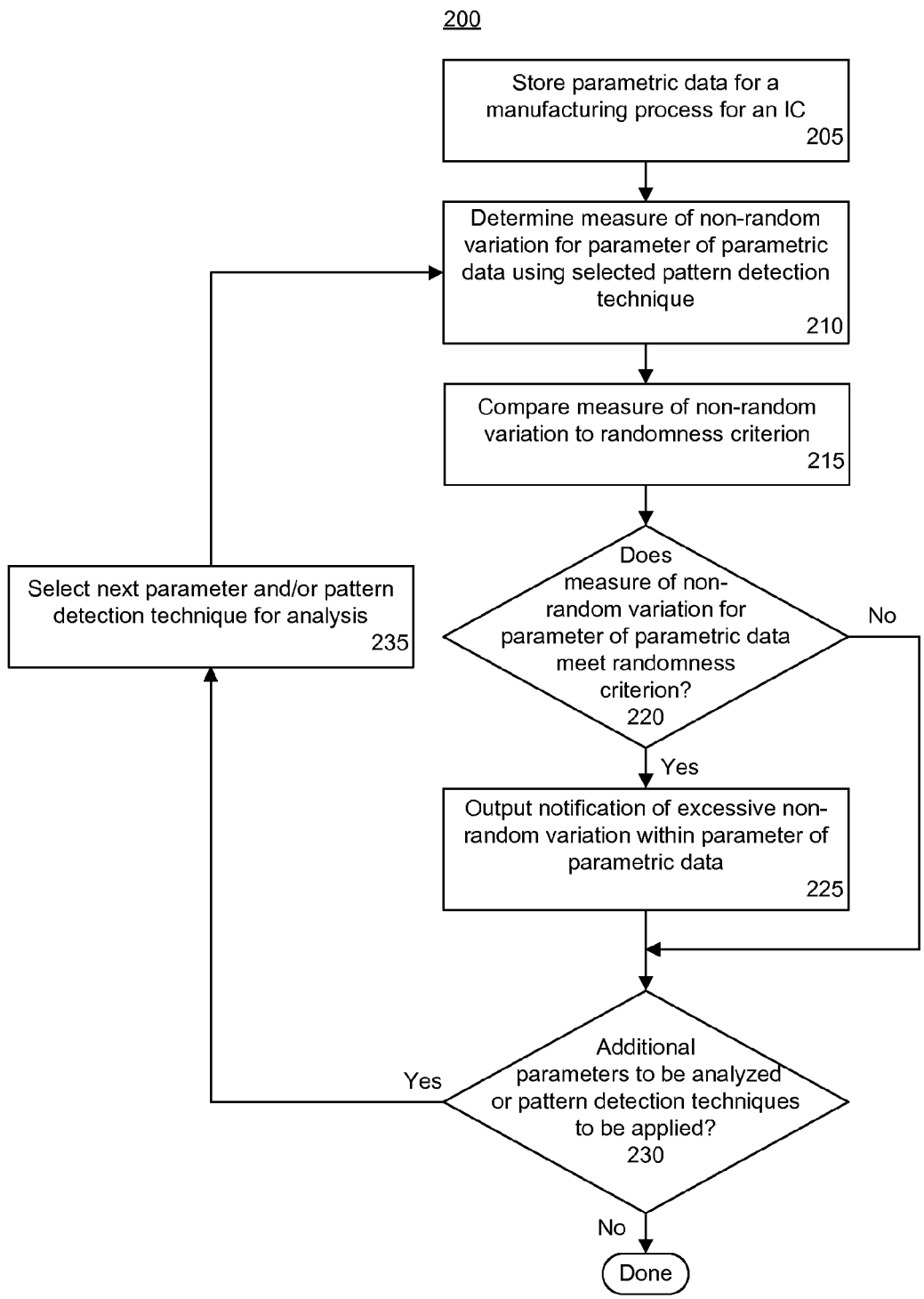
FIG. 2 is a first flow chart illustrating a method of improving yield of a manufacturing process for an IC in accordance with another embodiment of the present invention.

FIG. 2 is a first flow chart illustrating a method 200 of improving yield of a manufacturing process for an IC in accordance with another embodiment of the present invention. Method 200 can be implemented using a system as described with reference to FIG. 1. In general, method 200 describes a process of analyzing parametric data to detect non-random variation in selected items, or parameters, of the parametric data. Non-random variation in a parameter can be indicative of decreased IC product yield and further can indicate a cause of the decreased IC product yield.

Beginning in step 205, parametric data collected during a manufacturing process for an IC can be stored within memory of the system. The parametric data can include measurement parameters collected for the IC during wafer processing, wafer probe testing, package testing and sort, as well as any other data from the manufacturing process of the IC.

In step 210, the system can determine a measure of non-random variation for a selected parameter of the parametric data using a selected data pattern detection technique. A plurality of pattern detection techniques, stored in a library, can be used to analyze the parametric data. Each pattern detection technique can specify a unique method of determining non-random variation with respect to one or more parameters of the parametric data.

In one embodiment, the parameter(s) of the parametric data to be analyzed, and the pattern detection technique used to analyze the parameter(s), can be selectable by a user of the system. In another embodiment, the parameter(s) of the parametric data to be analyzed, and the pattern detection technique used to analyze the parameter(s), can be determined by the system automatically.

In step 215, the determined measure of non-random variation for the parameter can be compared to a randomness criterion, or to randomness criteria, as the case may be. The randomness criteria that is used can vary according to the particular pattern detection technique applied to the parametric data. More particularly, a different randomness criterion can be used for each pattern detection technique. In one embodiment, the randomness criteria can be a threshold level for the measure of non-random variation that, when exceeded, signifies an excessive level of non-random variation within the selected parameter(s) of the parametric data.

In decision box 220, the system can determine whether the measure of non-random variation for the parameter of the parametric data meets the randomness criterion. When the measure of non-random variation does not meet the randomness criteria, e.g., the measure of non-random variation does not exceed an established threshold, method 200 can proceed to decision box 230. When the randomness criteria are met, e.g., the measure of non-random variation does exceed a threshold, method 200 can proceed to step 225.

In step 225, the system can output a notification alerting a user of the system that the parametric data has met the randomness criteria, thereby exhibiting an unacceptable level of non-random variation. For example, the system can send an electronic mail or other electronic message, present a message upon a display, or provide another form of notification to a user. The notification can indicate the selected pattern detection technique, the measure of non-random variation, and the randomness criterion.

In decision box 230, when additional parameters are selected to be analyzed or additional pattern detection techniques are selected to be applied to the parameter or other parameters, method 200 can proceed to step 235. In step 235, the next parameter to be analyzed, or next data pattern detection technique with which to analyze the same or other parameter, can be selected. Method 200 can return to step 210 and continue analyzing the parametric data. When no further parameters or data pattern detection techniques are to be applied or analyzed, method 200 can end.

Figure 3:
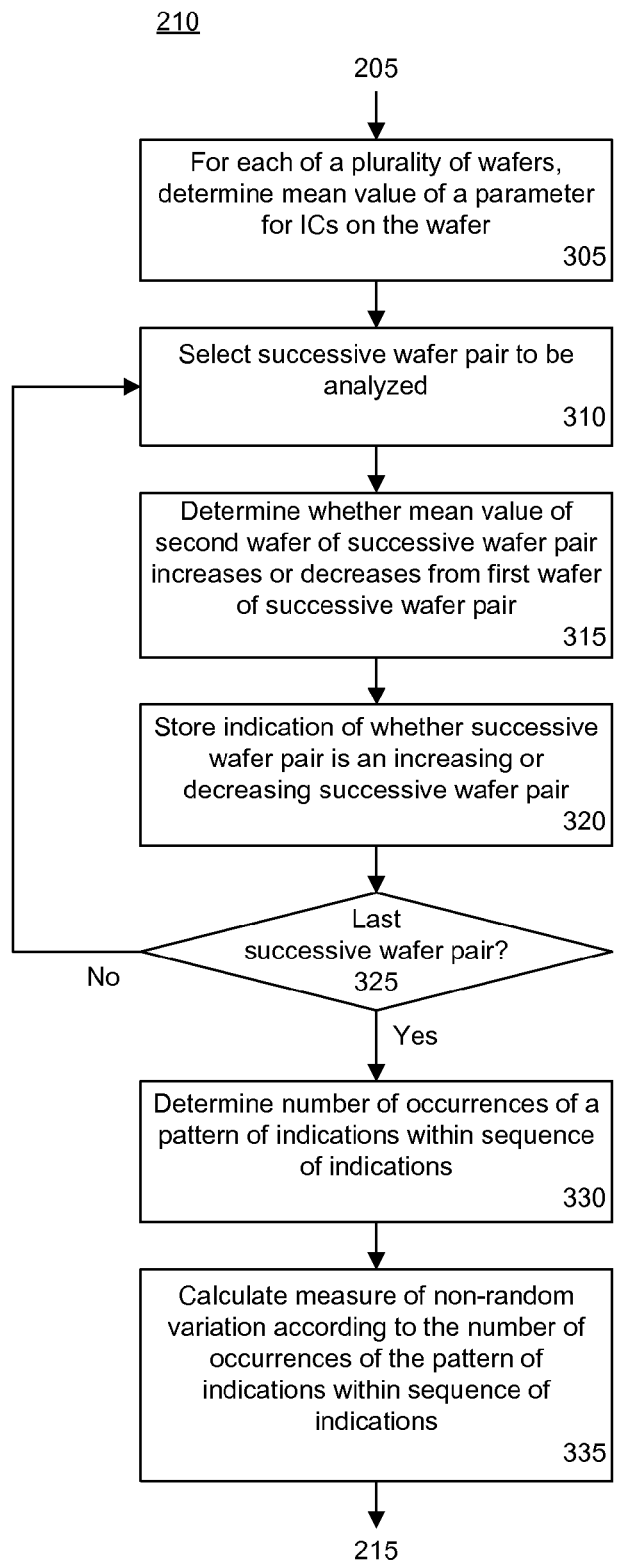
FIG. 3 is a second flow chart illustrating a method of determining a measure of non-random variation for a selected parameter of IC manufacturing data in accordance with another embodiment of the present invention.

FIG. 3 is a second flow chart illustrating a method of determining a measure of non-random variation for a selected parameter of IC manufacturing data in accordance with another embodiment of the present invention. More particularly, the method of FIG. 3 illustrates one embodiment of a method for determining a measure of non-random variation as described with reference to step 210 of FIG. 2.

Beginning in step 305, for each of a plurality of wafers, the system can determine a mean value of a parameter of the parametric data collected for the ICs on each wafer. In step 310, the system can select a wafer pair. The phrase "successive wafer pair" refers to two wafers that are paired from a group of wafers. The wafers within the group from which the successive wafer pairs are created can be numbered one through N, where N is an integer representing a total number of wafers within the group. Successive wafer pairs can be created by pairing each set of two numerically adjacent wafers together. For example, wafer one and wafer two can form a first successive wafer pair. Wafer two and wafer three can form the second successive wafer pair, etc.

The wafers of the group can be grouped according to a common feature of the wafers. For example, each wafer in the group can belong to a common wafer process lot. As used within this specification, a "process run lot" or "wafer process lot," can refer to one or more wafer(s) manufactured using a single manufacturing process run for an IC. In addition, the wafers can be numbered from one to N according to some characteristic of each wafer. For example, each wafer can be numbered according to the position of the wafer within the process run lot with one being the first wafer and N being the last wafer through the manufacturing process run. It should be appreciated that the wafers within the group can be numbered according to any of a variety of different attributes or ranking systems and need not be numbered according to order of fabrication or order of creation, for example.

In step 315, the system can determine whether the mean value of a second wafer of the selected successive wafer pair increases or decreases from a first wafer of the successive wafer pair. For example, a first wafer of the selected successive wafer pair can have a mean value of 100 ohms for a particular resistor within the ICs of the first wafer. A second wafer of the successive wafer pair can have a mean value of the resistor of 125 ohms within the ICs of the second wafer. Comparing the mean value of the second wafer, i.e., 125 ohms, to the mean value of the first wafer, i.e., 100 ohms, the system can determine that the successive wafer pair is an increasing successive wafer pair. When the mean value of the second wafer is less than the mean value of the first wafer, the successive wafer pair can be said to be a decreasing successive wafer pair.

In step 320, the system can store in memory an indication of whether the selected successive wafer pair is an increasing or a decreasing successive wafer pair. For example, six wafers can be formed into five successive wafer pairs. The system can compare the mean value of the first and second wafers within the first successive wafer pair and determine whether the first successive wafer pair is an increasing or decreasing successive wafer pair. An increasing successive wafer pair can be stored as a one and a decreasing successive wafer pair can be stored as a zero, for example. Indications for each of the five successive wafer pairs can be stored as a sequence of zeros and ones, e.g. 11011.

In decision box 325, the system can determine whether the successive wafer pair analyzed is the last successive pair within the group of wafers from which successive wafer pairs were formed. When the selected successive wafer pair is not the last successive wafer pair to be analyzed, the method can loop back to step 310 to continue processing a next successive wafer pair. When the selected successive wafer pair is the last successive wafer pair of the group of wafers, the method can continue to step 330.

In step 330, the system can determine a number of occurrences of a pattern of indications within the sequence of indications for the plurality of wafers. Depending upon the particular pattern detection technique selected, the system can determine a number of occurrences of a particular pattern of indications, associated with that particular pattern detection technique, within the sequence of indications. The greater the number of occurrences of the particular pattern of indications within the sequence of indications, the higher the probability that non-random variation is present within the sequence of indications and, accordingly, the parameter being analyzed.

Each pattern of indications can represent a type of non-random variation occurring within a parameter of the parametric data for the plurality of wafers. For example, a particular pattern detection technique can search for a pattern that indicates a parameter is increasing from wafer to wafer during a process lot run. Typically, wafers within a same process wafer lot are assumed to have been manufactured under an identical, or near identical, set of manufacturing process steps. When a sequence of indications generated by the system for successive wafer pairs of a process wafer lot do not vary randomly between increasing indications and decreasing indications, non-random variation of a parameter is occurring within the process wafer lot. For example, when each indication within a sequence of indications for five successive wafer pairs is an increasing indication, the variation within the sequence of indications may be considered non-random since the wafers successively increase from wafer to wafer within the plurality of wafers. This increase in the mean value of a parameter from wafer to wafer demonstrates a trend as opposed to random variation.

In step 335, the system can calculate a measure of non-random variation for the parameter of the parametric data collected for the plurality of wafers according to the number of occurrences of the pattern of indications within the sequence of indications. For example, a sequence of indications generated for a mean wafer value of a parameter of a series of successive wafer pairs is represented by a sequence of zeros and ones of 001001011. A selected data pattern detection technique invokes the system to search for the occurrence of a pattern of indications such as 001, for example, within the sequence of indications. The system can determine two occurrences of the 001 pattern of indications exist within the sequence of indications 001001011.

The system can calculate a measure of non-random variation for the mean value of the parameter within the plurality of wafers according to a number of occurrences of the particular pattern of indications within the sequence of indications. Subsequent to calculating the measure of non-random variation, the method can continue to step 215 of method 200 and compare the measure of non-random variation to a randomness criteria. For example, a calculated measure of non-random variation can be calculated according to the two occurrences of the pattern of indications 001. The measure of non-random variation, e.g., two, can be returned to step 215 of FIG. 2. In one embodiment, the number of occurrences can be weighted by a factor, with the result being the measure of non-random variation. In another embodiment, the system can attempt to detect more than one pattern, where different patterns can be weighted in terms of importance with the measure of non-random variation being a function of the number of times each of the different ones of the patterns are detected.

Figure 4:
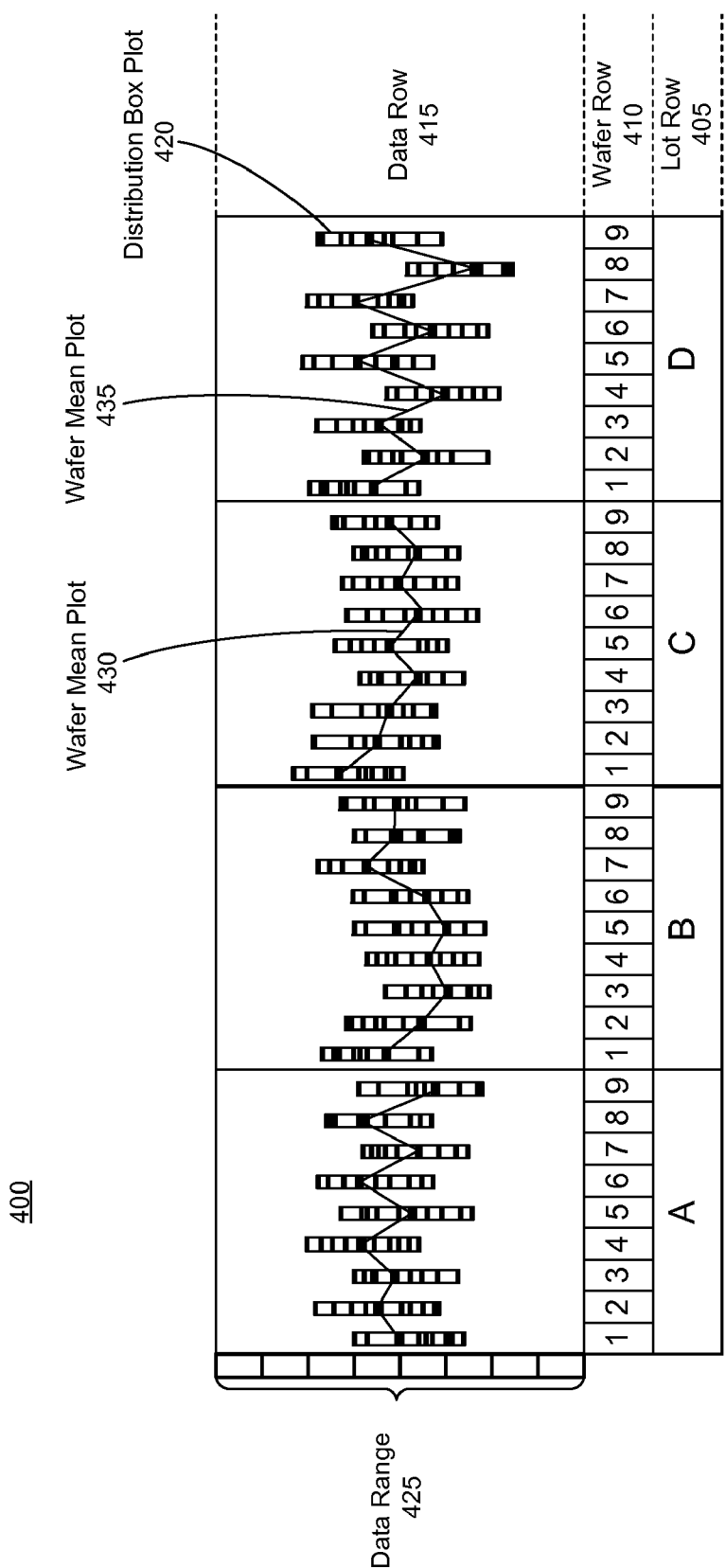
FIG. 4 is a first graph illustrating parametric data from an IC manufacturing process in accordance with another embodiment of the present invention.

FIG. 4 is a first graph 400 illustrating parametric data from an IC manufacturing process in accordance with another embodiment of the present invention. The parametric data presented within graph 400 illustrates an embodiment in which parametric data is analyzed to determine a measure of non-random variation for a process parameter of the parametric data collected from a manufacturing process for an IC that is caused by a known IC or process effect. The level of non-random variation can be monitored to detect when the level of non-random variation for a parameter is significant enough to degrade IC product yields. Graph 400 can include a lot row 405, a wafer row 410, a data row 415, a plurality of distribution box plots (box plots), and a data range 425.

The parametric data presented within graph 400 can represent a collection of values obtained from an IC manufacturing process, or a device testing protocol for an IC, for a parameter associated with the IC or a parameter associated with the manufacturing process for the IC. Lot row 405 within graph 400 identifies a particular process wafer lot to which a sub-set of the parametric data belongs. Wafer row 410 can identify a particular wafer within each process wafer lot to which each set of parametric values correspond. Data row 415 can contain a plurality of parametric values collected from particular wafers, wherein the data collected from each individual wafer is shown as a box plot. Each box plot, such as box plot 420, encloses a range of parametric values collected from an individual wafer. Additionally, each box plot presents a mean or median value for the parametric values collected for each wafer. Data range 425 displays a set of quantitative values that vertically align with, and identify the quantitative value of, the parametric values within each box plot as well as the value of the mean of the parametric data within each box plot.

For example, graph 400 can present resistance data for an IC. The data can be collected by measuring the resistance of a test device, within each IC, designed to be a 10 ohm resistor. In that case, box plot 420 represents parametric data collected for each test device built within each IC residing upon wafer nine of lot D. The vertical axis corresponds to, or represents, a data range 425, e.g., a resistance range that is measured in ohms. Data range 425 can be selected as one in which the expected mean of the data being plotted is approximately centered and the expected range for the data extends evenly above and below the mean. In the example pictured in FIG. 4, the expected mean can be approximately 10 ohms, with the resistance range 425 being demarcated in units of 1 ohm. Box plot 420 is positioned in data row 415 to align each resistance value collected from wafer nine with a same quantitative value within data range 425 as measured for each IC device.

In one embodiment, a user may desire to examine the influence of odd-even wafer effects upon the resistance data within graph 400. Odd-even effects result from differing physical positions of each wafer within a wafer lot when moving through a manufacturing process run. The user can select odd-even effect from the library as the data pattern detection technique with which to analyze the resistance data in graph 400. The system can determine the mean, the median, the standard deviation, and the range for the collection of resistance values within each box plot of graph 400.

As illustrated within graph 400 for wafer lot A of lot row 405, the box plots associated with odd numbered wafers have mean values that trend lower than the means of box plots associated with even numbered wafers. This trend can indicate a shifting of the mean value of a resistor within an IC located on an odd numbered wafer from the mean value of a resistor within an IC located within an even numbered wafer. This shifting of the mean value of box plots can indicate non-random variation being introduced into the resistor values for the ICs by odd-even effects occurring during the manufacturing process. Excessive non-random variation from odd-even effects can result in variation of performance parameters such as, for example, leakage current within particular wafers within wafer lot A.

A user can select odd-even effects from the library as a data pattern detection technique with which to determine a measure of non-random variation within a parameter of the parametric data of graph 400. The system can compare the measure of non-random variation for the parameter to randomness criteria. The randomness criteria can specify a threshold value for the measure of non-random variation that, when exceeded, indicates an excessive level of non-random variation from odd-even effects in the parameter of the parametric data. Measures of non-random variation for the parameter that exceed the threshold value can result in reductions in IC product yield for an IC manufacturing process. When the threshold value is exceeded, a notification can be generated alerting the user to excessive non-random variation from odd-even effects within the parameter that may reduce IC product yields, e.g., resistor variation excessive enough to result in inoperable ICs.

For example, referring to graph 400 in FIG. 4, tracking wafer mean plots 430 and 435, greater variation between the mean values of box plots for even numbered wafers and mean values of box plots for odd numbered wafers can be observed to occur within process lot D than occur within process lot C. Wafer mean plots 430 and 435 illustrate the movement of the mean value of each box plot between successive wafers in each of wafer lots C and D of graph 400. The slope of the line of wafer mean plots 430 and 435 between two successive box plots, whether positive or negative, indicates whether the mean wafer value of a successive wafer pair represented by the successive box plot is increasing or decreasing. Successive wafer pairs within wafer lot C and within wafer lot D can be analyzed by the system for non-random variation of the mean wafer value of the resistance for each of wafer lots C and D. Using wafer mean plots 430 and 435 and assuming an increasing successive wafer pair is indicated by a 1 and a decreasing successive wafer pair is indicated by a 0, the system can generate a sequence of indications of 00010101 for lot C and a sequence of indications of 01010101 for lot D.

To calculate a measure of non-random variation within wafer lot C and wafer lot D, the system can determine a number of occurrences of a pattern of indications, e.g., 01, within each of the sequence of indications for wafer lots C and D. A repeating 01 pattern of indications within a sequence of indications can reveal, for example, that the mean wafer value of each successive wafer in a wafer lot trends in an opposite direction from a proceeding wafer in the wafer lot. Expressed in a different manner, the 01 pattern of indications indicates that odd numbered wafers within the wafer lot have a consistently higher mean wafer value than even numbered wafers within the wafer lot. This pattern of variation of the mean value of the resistance of each wafer of a wafer lot is non-random, as opposed to a randomly dispersed series of 0's and 1's within a sequence of indications.

Continuing, the system can determine that 3 occurrences of the pattern of indications 01 exist in the sequence of indications for lot C and 4 occurrences of the pattern of indications 01 exist in the sequence of indications for lot D. To calculate a measure of non-random variation, the equation $M_{NV}=(N_{OCC}*N_P)/N_{SEQ}$ can be applied to the parametric data of wafer lots C and D. In this equation, $M_{NV}$ represents the measure of non-random variation, $N_{OCC}$ represents a number of occurrences of a pattern of indications within a sequence of indications, $N_P$ represents a number of indications in the pattern of indications, and $N_{SEQ}$ represents a number of indications in a sequence of indications. Implementing this equation for the sequence of indications generated for lots C and D, returns a measure of non-random variation of 0.75 for lots C, i.e., 3*2/8=0.75, and a measure of non-random variation of 1.00 for lot D, i.e., 4*2/8=1.00. As the measure of non-random variation for lot D is greater than lot C, the mean wafer value of the resistance exhibits greater levels of non-random variation associated with odd-even effects in wafer lot D than exhibited in wafer lot C.

The measures of non-random variation for wafer lots C and D can be compared to randomness criteria. In one embodiment, the system can output a notification when the measure of non-random variation of a wafer lot exceeds the randomness criteria. For example, the randomness criteria can be a threshold level of 0.8. When the measure of non-random variation exceeds 0.8, the system can output a notification pertaining to the relevant wafer lot. In that case, a notification, e.g., a colored highlighting of the measure of non-randomness variation for the parameter, can be output for wafer lot D since the measure of non-random variation for wafer lot D is greater than 0.8. No notification would be generated for wafer lot C since the measure of non-random variation does not exceed 0.8.

It should be appreciated that while specified predetermined bit patterns are provided as examples of bit patterns for which the system can search within an indication sequence, the system is not limited in this regard. The system can apply any of a variety of different statistical and/or stochastic techniques to determine whether a given sequence of indications is random or non-random. For example, various compression techniques can be applied to the sequence of indications to determine a measure of non-randomness that is correlated with the amount of compression achieved.

Figure 5:
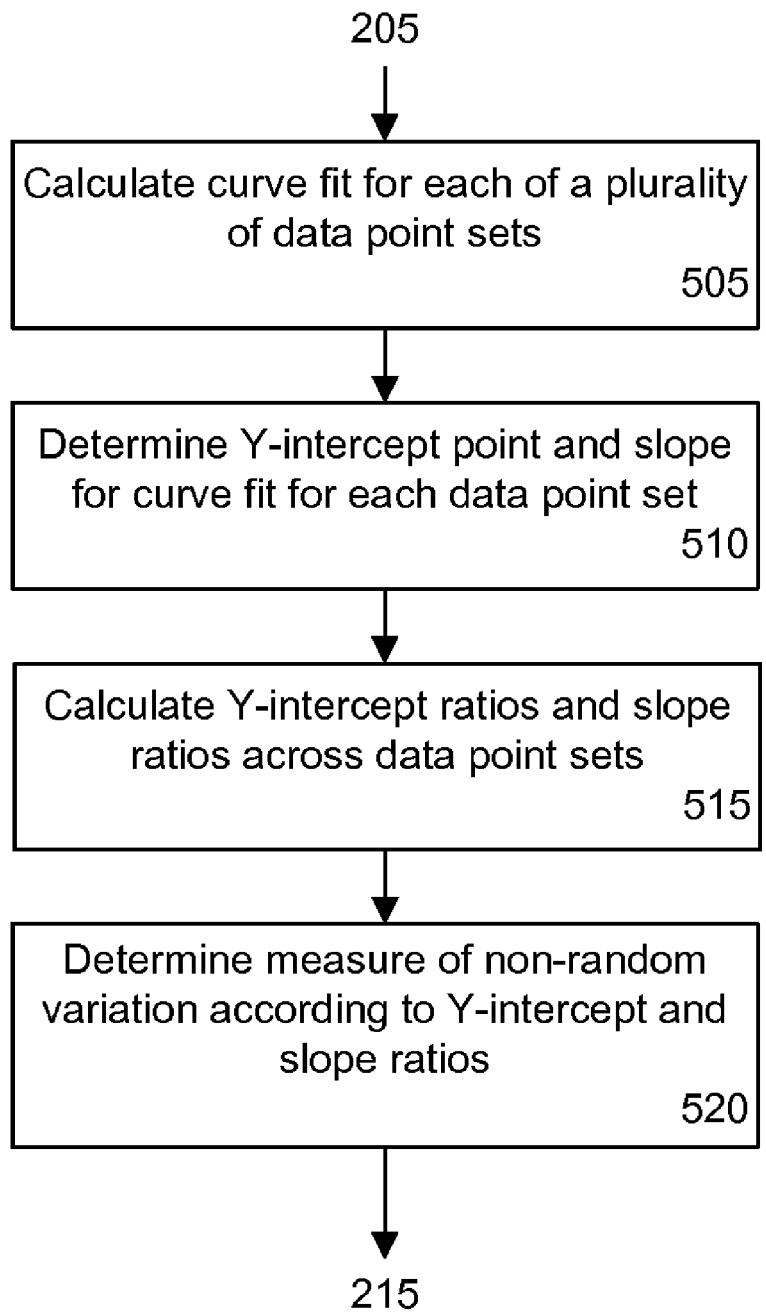
FIG. 5 is a third flow chart illustrating a method of determining a measure of non-random variation for a selected parameter of IC manufacturing data in accordance with another embodiment of the present invention.

FIG. 5 is a third flow chart illustrating a method of determining a measure of non-random variation for a selected parameter of IC manufacturing data in accordance with another embodiment of the present invention. More particularly, the method of FIG. 5 illustrates another embodiment of a method for determining a measure of non-random variation as described with reference to step 210 of FIG. 2.

Beginning in step 505, the system can calculate a curve fit for each of a plurality of data point sets representing parametric data related to the manufacturing of an IC. Each data point set can include two or more data points grouped according to a common feature. For example, each data point for a data point set can represent parametric data collected from an individual wafer. Each data point represents a first parameter of the parametric data plotted as a function of a second parameter of the parametric data. For example, a data point can represent a maximum measured output frequency of, and, inversely, the time delay, through a feedback path within a ring oscillator residing within an IC that is plotted as a function of total leakage current measured through the IC. The leakage current can be denoted as $I_{LK}$. The curve fitting performed by the system can include, but is not limited to, linear curve fitting, polynomial curve fitting, cubic fitting, geometric curve fitting, exponential curve fitting, or the like.

In step 510, the system can determine a Y-intercept point and a slope for each curve fit calculated for a data point set. In step 515, the system can calculate Y-intercept ratios and slope ratios across data point sets. More particularly, for each Y-intercept (and thus data point set), a ratio can be calculated with the selected Y-intercept to each other Y-intercept. For example, curve fitting can be performed for each of 3 data point sets with a Y-intercept point being determined for each curve fit. The Y-intercept points of the three data point sets, referred to as data set one, data set two, and data set three, can be represented as $A_1$, $A_2$, and $A_3$, respectively. The Y-intercept ratios for data point set one can be defined as $A_1/A_2$, and $A_1/A_3$. The Y-intercept ratios for data point set two can be defined as $A_2/A_1$, and $A_2/A_3$. The Y-intercept ratios for data point set three can be defined as $A_3/A_1$, and $A_3/A_2$.

A similar procedure can be performed with respect to slopes of the different curve fits of the data point sets. For example, curve fitting can be performed for each of 3 data point sets and a slope determined for each curve fit. The slope of the three curve fits, in reference to data set one, data set two, and data set three, can be represented as $B_1$, $B_2$, and $B_3$, respectively. The slope ratios for data point set one can be defined as $B_1/B_2$, and $B_1/B_3$. The slope ratios for data point set two can be defined as $B_2/B_1$, and $B_2/B_3$. The slope ratios for data point set three can be defined as $B_3/B_1$, and $B_3/B_2$.

In step 520, the system can determine a measure of non-random variation for each data point set according to the Y-intercept and slope ratios calculated for each data point set. The method can continue to step 215 of method 200 and compare the measure of non-random variation of each data point set to randomness criteria. For example, increasing and decreasing Y-intercept and/or slope ratio pairs can be determined to derive a sequence of indications as described. The sequence of indications can be processed to derive a measure of non-random variation.

Figure 6:
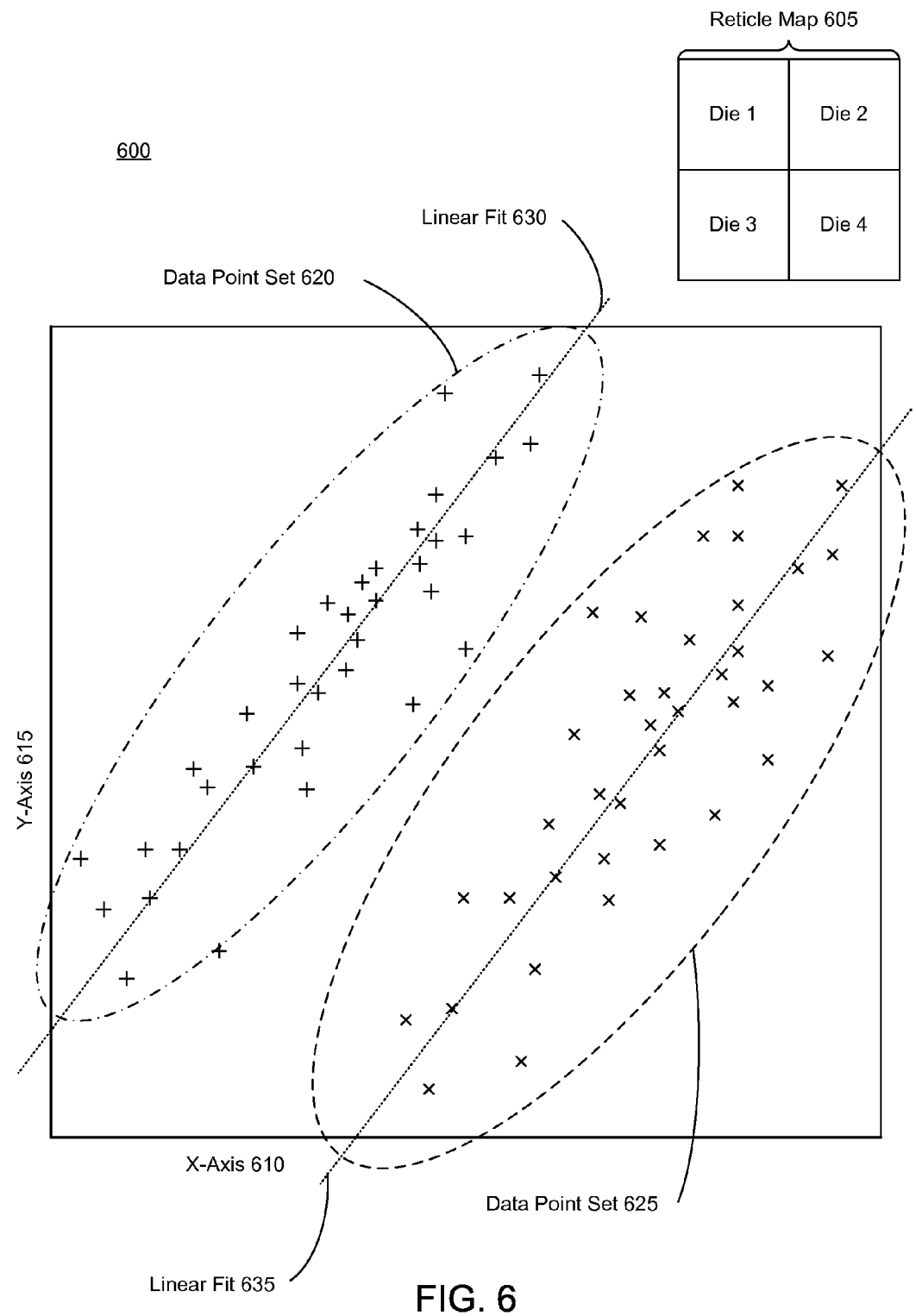
FIG. 6 is a second graph illustrating parametric data from an IC manufacturing process in accordance with another embodiment of the present invention.

FIG. 6 is a second graph 600 illustrating parametric data collected during an IC manufacturing process in accordance with another embodiment of the present invention. The parametric data presented within graph 600 illustrates one embodiment of the method described with reference to FIG. 5, wherein each data point set of the parametric data is analyzed to determine a measure of non-random variation within the data point set, caused by a known IC or process effect. Graph 600 can include an X-axis 610, a Y-axis 615, data point set 620, data point set 625, linear curve fit 630, and linear curve fit 635.

Graph 600 illustrates two data point sets, i.e., data point sets 620 and 625, each being comprised of a plurality of data points representing parametric data from a manufacturing process for an IC. Each data point represents a first parameter of the parametric data plotted as a function of a second parameter of the parametric data. For example, a data set can include a plurality of data points, each data point representing a measured leakage current, denoted as $I_{LK}$, within an IC versus a measured value of a signal path time delay through a transistor device implemented within the IC. In that case, X-axis 610, being a measure of current, can be expressed in milliamps. Y-axis 615, being a measure time delay, can be expressed in nanoseconds.

Typically, the first parameter and the second parameter of a data point are correlated in some manner. Plotting data points as presented in graph 600 can visually illustrate the effect of the second parameter upon the first parameter. For example, an increase in $I_{LK}$ within a transistor typically negatively affects the speed of, and time delay through, the transistor. Plotting data points representing the time delay through the transistor as a function of $I_{LK}$ within the transistor can visually demonstrate the relationship between $I_{LK}$ and transistor speed.

As illustrated in FIG. 6, each of data point sets 620 and 625 can represent parametric data collected for two sites within a reticle field used to manufacture an IC. Data point set 620 is collected from ICs manufactured at die sites one and four of reticle map 605. Data point set 625 is collected from ICs manufactured at die sites two and three of reticle map 605. A "reticle" refers to an etched glass surface through which patterns on a semiconductor material can be optically defined. Each reticle defines a pattern on the semiconductor material associated with a process layer in the manufacturing process for an IC device. As die sites one and four of reticle map 605 are at opposing corners and die sites two and three of reticle map 605 are at opposing corners, comparing data point set 620 to data point set 625 can reveal non-random variation within the parametric data that may be associated with causes of variation between the four reticle fields. For example, this variation can result from misalignment of a reticle during manufacturing of an IC with the reticle.

A linear curve fit can be applied by the system to each of data point sets 620 and 625. Linear curve fit 630 represents a linear curve fit for data point set 620. Linear curve fit 635 represents a linear curve fit for data point set 625. Each of linear curve fits 630 and 635 can be represented with an equation Y=A*X+B, with A being the slope and B being the Y-intercept point of the linear curve fit. A ratio can be calculated between the Y-intercept point of linear curve fit 630 and the Y-intercept point of linear curve fit 635. Additionally, a ratio can be calculated between the slope of linear curve fit 630 and the slope of linear curve fit 635. For example, linear curve fits 630 and 635 can be represented by equations $Y=A_1*X+B_1$ and $Y=A_2*X+B_2$, respectively. A measure of non-random variation for data point sets 620 and 625 can be calculated using the ratios $A_1/A_2$ and $A_2/A_1$, respectively. In a similar manner, a measure of non-random variation for data point sets 620 and 625 can be calculated using the ratios $B_1/B_2$ and $B_2/B_1$, respectively. In one embodiment, three or more data point sets may be used. In that case, multiple ratios may be calculated for each data point set between the slope of the data point set and the slope of each other data point set. Similarly, multiple ratios may be calculated for each data point set between the Y-intercept point of the data point set and the Y-intercept point of each other data point set.

The measures of non-random variation for each of data point sets 620 and 625 can be compared to randomness criteria. In one embodiment, the system can output a notification, e.g., a notification via email or instant messaging, when the measure of non-random variation of either data point sets 620 and/or 625 exceeds the randomness criteria. As noted, ratios of the Y-intercepts and/or slopes can be compared with thresholds defined as the randomness criteria. It should be appreciated that Y-intercept ratios can be evaluated independently of slope ratios or can be evaluated in combination, e.g., where the ratio of Y-intercept and slope of given data point sets can be compared with a threshold. Emerging patterns of the ratios also can be determined, with occurrences of such patterns being used as the measure of non-randomness to be compared against the randomness criteria.

Figure 7:
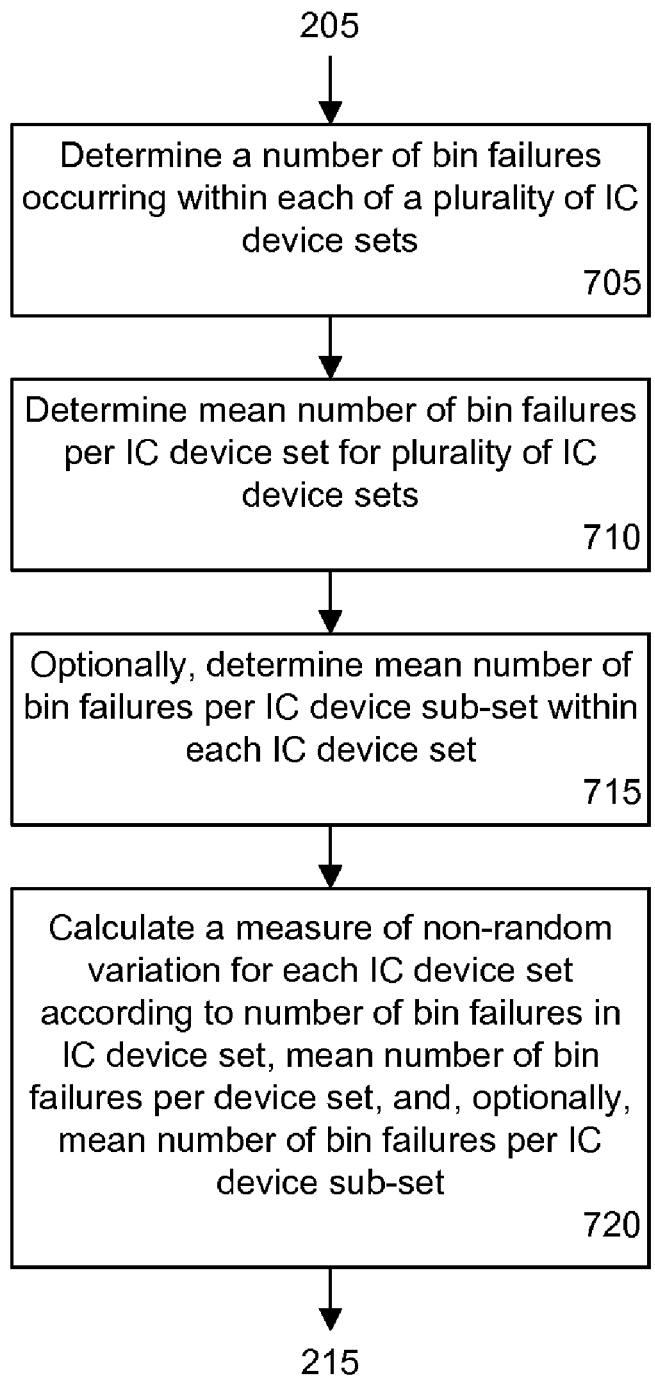
FIG. 7 is a fourth flow chart illustrating a method of determining a measure of non-random variation for a selected parameter of IC manufacturing data in accordance with another embodiment of the present invention.

FIG. 7 is a fourth flow chart illustrating a method of determining a measure of non-random variation for a selected parameter of IC manufacturing data in accordance with another embodiment of the present invention. More particularly, the method of FIG. 7 illustrates another embodiment of a method for determining a measure of non-random variation as described with reference to step 210 of FIG. 2.

Beginning in step 705, the system can determine a number of bin failures occurring within each of a plurality of IC device sets for a particular bin failure type. Each IC device set includes two or more ICs grouped according to a common feature. For example, each of a plurality of ICs within an IC device set can be manufactured within a single silicon wafer. Each bin failure represents an IC device failure occurring within an IC device set. A used within this specification, a "bin failure," refers to a determination that an IC device is inadequate for sale or use as a result of a particular inadequacy in the manufacturing process or the performance of the IC. Each bin failure type designates a particular inadequacy responsible for the failure of the IC, i.e., a bin failure type.

In step 710, the system can determine a mean number of bin failures occurring per IC device set, for the plurality of IC device sets, for a particular bin failure type. For example, for a particular bin type, the plurality of IC device sets can include an IC device set A in which three bin failures occur, an IC device set B in which two bin failures occur, and an IC devices set C in which four bin failures occur. In that case, the mean number of bin failures occurring per IC device set for IC device sets A, B, and C is three, i.e., (3+2+4)/3=3.

In step 715, where each of the plurality of IC device sets is comprised of a plurality IC device sub-sets, the system can optionally determine a mean number of bin failures, for the particular bin failure type, occurring per IC device sub-set for each of the plurality of IC device sub-sets within each IC device set. In one embodiment, each of the plurality of IC device sets can be comprised of a plurality of sub-sets of IC devices, which, when combined, form each IC device set. For example, IC device set A can be comprised of IC device sub-sets $A_1$, $A_2$, and $A_3$. IC device sub-sets $A_1$, $A_2$, and $A_3$ collectively form IC device set A. A mean number of bin failures per IC device sub-set for each of the plurality of IC device sub-sets can be determined by summing the number of bin failures occurring within each of IC device sub-sets $A_1$, $A_2$, and $A_3$, and dividing the sum by the total number of IC device sub-sets in IC device set A. For example, IC devices sub-sets $A_1$, $A_2$, and $A_3$ can have one, two, and three bin failures, respectively. In that case, the mean number of bin failures occurring per IC device sub-set within IC device set A is two, i.e., 1+2+3/3=2.

In step 720, the system can calculate a measure of non-random variation for each IC device set according to a number of bin failures occurring within the IC device set, the mean number of bin failures occurring per IC device set, and, optionally, the mean number of bin failures occurring per IC device sub-set for the plurality of IC device sub-sets within the IC device set. The method 700 can then return to step 215 of method 200 and compare the measure of non-random variation for each IC device set to a randomness criteria.

Figure 8:
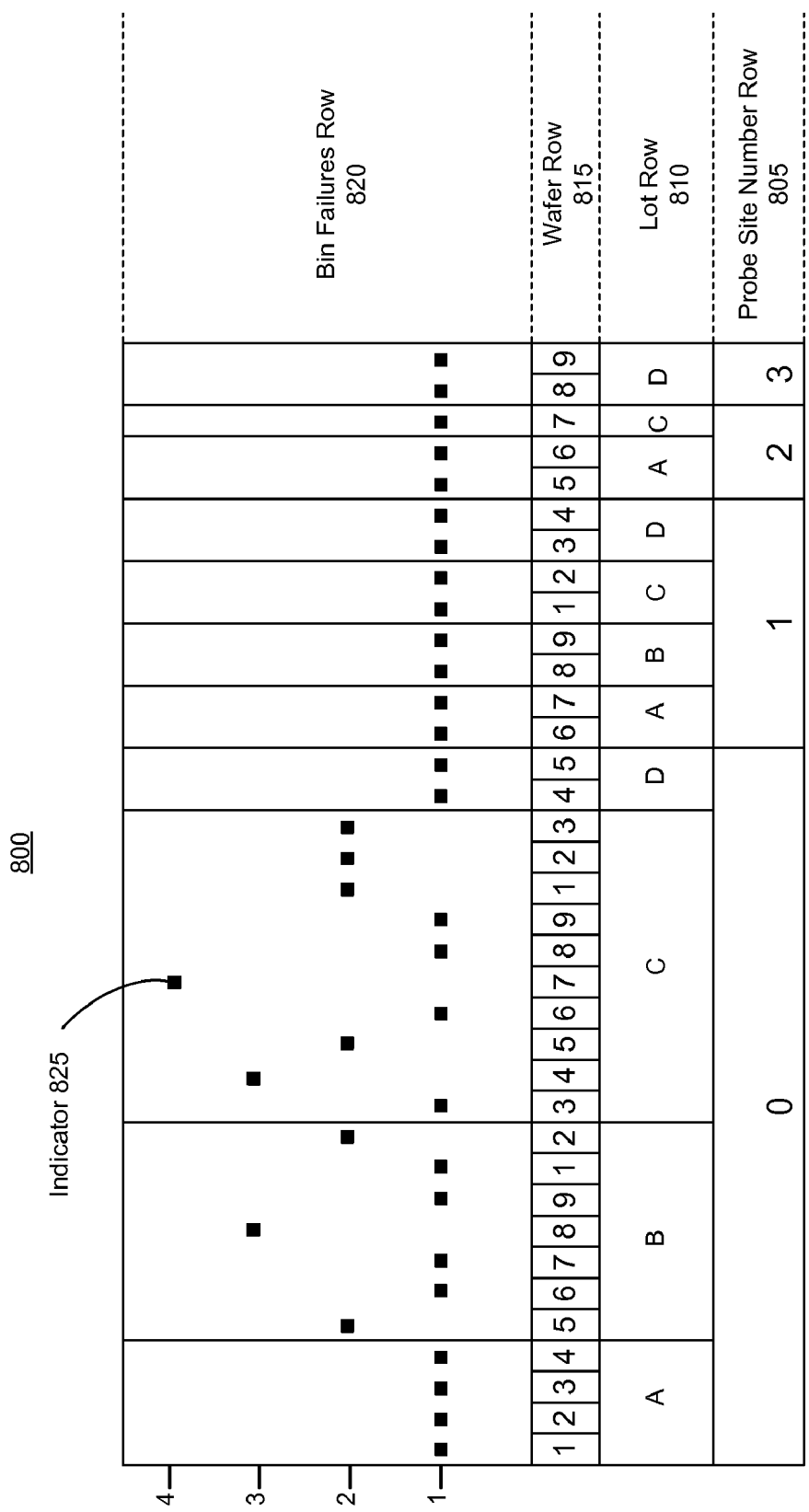
FIG. 8 is a third graph illustrating parametric data collected from IC manufacturing process in accordance with another embodiment of the present invention.

FIG. 8 is a third graph 800 illustrating parametric data from an IC manufacturing process in accordance with another embodiment of the present invention. The parametric data within graph 800 illustrates an embodiment in which an IC device set is analyzed to determine a measure of non-random variation, caused by a known IC or process effect occurring within the IC device set. Graph 800 can include a plurality of rows labeled as probe site number row (site number row) 805, lot row 810, wafer row 815, and bin failures row 820.

The parametric data presented within graph 800 can represent parametric data collected via probe card testing during the manufacturing of an IC device. The parametric data presents a number of bin failures of IC devices, identified through probe card testing and identified as a particular bin failure type, occurring during the manufacturing process. In conventional probe card testing of IC devices, whether at wafer level testing or at packaged IC level testing, a multisited test probe card can be used that tests performance parameters of multiple ICs simultaneously. Site number row 805 identifies the probe site within the test probe card at which a bin failure occurred for an IC. As illustrated within graph 800, site number row 805 identifies a probe site of the test probe card labeled as sites zero, one, two, and three, wherein each has been associated with a particular bin failure.

Lot row 810 identifies a wafer lot run in which an IC associated with a particular bin failure was manufactured. Wafer row 815 identifies a particular wafer within a wafer lot run in which the IC associated with the particular bin failure was manufactured. Bin failure row 820 illustrates a quantity of bin failures occurring within a particular wafer of a particular wafer lot run tested at a particular probe card site. The quantitative number of bin failures, for a particular bin failure type, occurring within a particular wafer of a particular wafer lot run tested at a particular probe card site is identified graphically by the indicators, e.g., indicator 825, located directly above the wafer associated with the quantity of bin failures in bin failures row 820.

For example, only one instance of four bin failures within one wafer occurs within graph 800, at indicator 825. Aligned directly beneath indicator 825, within wafer row 815, wafer seven is the wafer identified as the wafer associated with the four bin failures. Directly beneath wafer seven and indicator 825, in lot row 810, lot C is the process wafer lot associated with the four bin failures. Directly below lot C and indicator 825, in site number row 805, probe card site zero is the probe card site associated with the four bin failures. Accordingly, the only instance of four bin failures occurring within the parametric data of graph 800 was collected at probe card site zero, within wafer seven, of wafer lot C.

In one embodiment, the system can determine a measure of non-random variation within an IC device set. The IC device set can include all ICs manufactured within a same silicon wafer. The system can determine a number of bin failures occurring within each wafer for a particular bin failure type. Each of the plurality of IC device sets can include each wafer manufactured with a single wafer lot. The system can determine the mean number of bin failures occurring per wafer within the wafer lot for the particular bin failure type. Using the number of bin failures for each wafer and the mean number of bin failures occurring per wafer within the wafer lot, the system can determine a measure of non-random variation for each wafer manufactured within the process wafer lot.

For example, referring to FIG. 8, the system can determine a number of bin failures occurring within each wafer of wafer lot C collected at probe site zero for a particular bin failure type. The system can determine a mean number of bin failures occurring per wafer, for the particular bin failure type, within wafer lot C as the total number of bin failures occurring within wafer lot C divided by the total number of wafers within wafer lot C, i.e., 19/10=1.9. The system can calculate a measure of non-random variation within each wafer using the equation: $M_{NV}=(N_W-N_{AVE})/N_{AVE}$. In this equation, $M_{NV}$ represents the measure of non-random variation, $N_W$ represents a number of bin failures occurring within a wafer and $N_{AVE}$ represents an average number of bin failures occurring per wafer. Using this equation, the measure of non-random variation within wafer four is (3−1.9)/1.9, or 0.58. The measure of non-random variation for wafer seven is (4−1.9)/1.9, or 1.10. The measure of non-random variation for wafer nine is (1−1.9)/1.9, or −0.47. A value of zero for $M_{NV}$ represents a lack of non-random variation in a wafer. Accordingly, as wafer nine has a measure of non-random variation nearest to zero, i.e., −0.47, wafer nine exhibits the lowest level of non-random variation of the three wafers. Wafer seven, having the measure of non-random variation furthest from zero, i.e., 1.1, exhibits the highest level of non-random variation of the three wafers.

In another embodiment, each of the plurality of IC device sets can include at least one IC from at least one wafer of at least one wafer process lot tested at a particular test probe site. The system can determine a number of bin failures occurring among ICs tested at each test probe site for a particular bin failure type. The system, optionally, can determine a mean number of bin failures occurring per wafer among the wafers collected at each probe test site for the particular bin failure type. Using the mean number of bin failures occurring per wafer for each test probe site, the system can calculate a measure of non-random variation for each test probe site.

For example, referring to FIG. 8, the system can determine a mean number of bin failures per wafer for each of probe test sites zero through three for a particular bin failure type. The mean number of bin failures occurring, for the particular bin failure type, per wafer for each probe test site can be determined by dividing the total number of bin failures occurring at each test probe site by the total number of wafers tested at the test probe site. For probe site zero, the mean number of bin failures occurring per wafer equals [(12*1)+(6*2)+(2*3)+(1*4)]/(4+7+9+2), or 1.55 bin failures occurring per wafer. Within this expression, referring to the numerator, the numbers "12," "6," "2," and "1" of each factor pair indicate the number of wafers with one, two, three, and four bin failure(s) per wafer, respectively, tested at probe site zero. Within the denominator, the numbers "4," "7," "9," and "2" represent the number of wafers in lots A, B, C, and D, respectively, tested at probe site zero.

At each of test probe sites one, two and three, the mean number of bin failures occurring per wafer equals one as each wafer at test probe sites one through three has exactly one bin failure. Accordingly, test probe site zero exhibits greater non-random variation in the number of bin failures occurring per wafer than test probe sites one through three. The increased level of non-random variation in test probe site zero may indicate a problem with the operation of test probe site zero when testing IC devices. As a result, IC devices tested at test probe site zero may be classified as bin failures that are actually fully functional IC devices.

The embodiments disclosed within this specification can be implemented to monitor IC product yield for a variety of different types of ICs, whether custom ICs, application specific integrated circuits (ASICs), mixed signal ICs, or programmable ICs. Programmable ICs are a type of IC that can be programmed to perform specified logic functions.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

Embodiments of the present invention can be realized in hardware or a combination of hardware and software. The embodiments can be realized in a centralized fashion in one system or in a distributed fashion where different elements are spread across several interconnected systems. Any kind of data processing system or other apparatus adapted for carrying out the methods described herein is suited.

Embodiments of the present invention further can be embedded in a device such as a computer program product, which comprises all the features enabling the implementation of the methods described herein. The device can include a data storage medium or device, e.g., a computer-usable or computer-readable device, storing program code that, when loaded and executed in a system comprising memory and a processor, causes the system to perform the operations described herein. Examples of data storage devices can include, but are not limited to, optical devices, magnetic devices, magneto-optical devices, computer memory such as random access memory or hard disk(s), or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The embodiments disclosed herein can be embodied in other forms without departing from the spirit or essential attributes thereof. Accordingly, reference should be made to the following claims, rather than to the foregoing specification, as indicating the scope of the embodiments of the present invention.

What is claimed is:

1. Within a system comprising a processor and a memory, a method of analyzing integrated circuit (IC) product yield, the method comprising:
    storing, within the memory, parametric data from a manufacturing process for an IC;
    determining a measure of non-random variation for at least one parameter of the parametric data using a pattern detection technique;
    comparing, by the processor, the measure of non-random variation to a randomness criterion; and
    selectively outputting a notification indicating that variation in the at least one parameter is non-random according to the comparison of the measure of non-random variation to the randomness criterion;
    wherein determining a measure of non-random variation further comprises:
    determining a mean value for at least one parameter of the parametric data for each of a plurality of wafers, wherein each wafer comprises a plurality of the ICs;
    for each of a plurality of successive wafer pairs, determining whether the mean value for a second wafer of the successive wafer pair increases or decreases from the mean value of a first wafer of the successive pair of wafers;
    storing an indication of whether the mean value increases or decreases for each successive wafer pair as a sequence of indications; and
    calculating a measure of non-random variation according to the sequence of indications.

2. The method of claim 1, wherein calculating a measure of non-random variation according to the sequence of indications further comprises:
    determining a number of occurrences of a pattern of indications within the sequence of indications; and
    calculating the measure of non-random variation according to the number of occurrences of the pattern of indications.

3. Within a system comprising a processor and a memory, a method of analyzing integrated circuit (IC) product yield, the method comprising:
    storing, within the memory, parametric data from a manufacturing process for an IC;
    determining a measure of non-random variation for at least one parameter of the parametric data using a pattern detection technique;
    comparing, by the processor, the measure of non-random variation to a randomness criterion; and
    selectively outputting a notification indicating that variation in the at least one parameter is non-random according to the comparison of the measure of non-random variation to the randomness criterion;
    wherein determining a measure of non-random variation comprises:
    for each of a plurality of data point sets, wherein each data point set comprises a plurality of data points for at least one parameter within the parametric data, calculating a curve fit for the data point set; and
    calculating the measure of non-random variation according to ratios of Y-intercept points of the curve fits.

4. The method of claim 3, wherein:
    each data point set comprises a plurality of data points collected from a plurality of the ICs associated with at least one site within a reticle field; and
    the reticle field corresponds to a reticle used during the manufacturing process.

5. Within a system comprising a processor and a memory, a method of analyzing integrated circuit (IC) product yield, the method comprising:
    storing, within the memory, parametric data from a manufacturing process for an IC;
    determining a measure of non-random variation for at least one parameter of the parametric data using a pattern detection technique;
    comparing, by the processor, the measure of non-random variation to a randomness criterion; and
    selectively outputting a notification indicating that variation in the at least one parameter is non-random according to the comparison of the measure of non-random variation to the randomness criterion;
    wherein determining a measure of non-random variation comprises:
    for each of a plurality of data point sets, wherein each data point set comprises a plurality of data points for at least one parameter of the parametric data, calculating a curve fit for the data point set; and
    calculating the measure of non-random variation according to ratios of slopes of the curve fits.

6. The method of claim 5, wherein:
    each data point set corresponds to a plurality of data points collected from a plurality of the ICs associated with at least one site within a reticle field; and
    the reticle field corresponds to a reticle used during the manufacturing process.

7. Within a system comprising a processor and a memory, a method of analyzing integrated circuit (IC) product yield, the method comprising:
    storing, within the memory, parametric data from a manufacturing process for an IC;

determining a measure of non-random variation for at least one parameter of the parametric data using a pattern detection technique;

comparing, by the processor, the measure of non-random variation to a randomness criterion; and selectively outputting a notification indicating that variation in the at least one parameter is non-random according to the comparison of the measure of non-random variation to the randomness criterion;

wherein determining a measure of non-random variation comprises:

for each of a plurality of IC device sets, wherein each IC device set comprises at least one IC manufactured using the manufacturing process, determining a number of bin failure occurrences within each IC device set;

determining a mean number of bin failure occurrences per IC device set; and calculating the measure of non-random variation according to the number of bin failure occurrences within the IC device sets and the mean number of bin failure occurrences per IC device set.

8. The method of claim 1, wherein the measure of non-random variation is calculated from parametric data for at least two ICs.

9. The method of claim 3, wherein the measure of non-random variation is calculated from parametric data for at least two ICs.

10. The method of claim 5, wherein the measure of non-random variation is calculated from parametric data for at least two ICs.

11. The method of claim 7, wherein the measure of non-random variation is calculated from parametric data for at least two ICs.

* * * * *